United States Patent
Choi et al.

(10) Patent No.: US 10,355,004 B2
(45) Date of Patent: Jul. 16, 2019

(54) MEMORY DEVICES INCLUDING ONE-TIME PROGRAMMABLE MEMORY CELLS

(71) Applicants: Hyun-Min Choi, Uiwang-si (KR); Sangwoo Pae, Seongnam-si (KR); Hagju Cho, Seongnam-si (KR)

(72) Inventors: Hyun-Min Choi, Uiwang-si (KR); Sangwoo Pae, Seongnam-si (KR); Hagju Cho, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 231 days.

(21) Appl. No.: 14/845,321

(22) Filed: Sep. 4, 2015

(65) Prior Publication Data

US 2016/0093621 A1 Mar. 31, 2016

(30) Foreign Application Priority Data

Sep. 29, 2014 (KR) .................. 10-2014-0130192

(51) Int. Cl.
*H01L 27/112* (2006.01)
*G11C 17/08* (2006.01)

(52) U.S. Cl.
CPC .......... *H01L 27/1126* (2013.01); *G11C 17/08* (2013.01)

(58) Field of Classification Search
CPC .... H01L 27/105; H01L 27/1126; G11C 17/08
See application file for complete search history.

(56) References Cited

U.S. PATENT DOCUMENTS

| | | | | |
|---|---|---|---|---|
| 5,021,355 | A * | 6/1991 | Dhong | H01L 21/2236 257/E21.143 |
| 5,468,938 | A * | 11/1995 | Roy | A01M 1/226 219/690 |
| 6,083,798 | A * | 7/2000 | Lin | H01L 29/41775 257/E21.151 |
| 6,515,931 | B2 | 2/2003 | Marr et al. | |
| 8,283,731 | B2 | 10/2012 | Luan | |
| 8,313,987 | B2 | 11/2012 | Kurjanowicz et al. | |
| 8,330,189 | B2 | 12/2012 | Luan et al. | |
| 8,742,457 | B2 | 6/2014 | Yang | |
| 8,848,423 | B2 | 9/2014 | Chung | |
| 8,891,328 | B2 | 11/2014 | Li | |
| 8,933,492 | B2 | 1/2015 | Kurjanowicz | |

(Continued)

OTHER PUBLICATIONS

Kulkarni, et al., A 32nm High-k and Metal-Gate Anti-Fuse Array Featuring a 1.01μm² 1T1C Bit Cell, Symposium on VLSI Technology Digest of Technical Papers, *IEEE*, 2012, pp. 79-80.

*Primary Examiner* — Dale E Page
*Assistant Examiner* — Quovaunda V Jefferson
(74) *Attorney, Agent, or Firm* — Myers Bigel, P.A.

(57) ABSTRACT

A memory device including one-time programmable memory cells has a semiconductor substrate with a write region and a read region, a write gate provided on the write region, a read gate provided on the read region, first and second junction patterns provided at both sides of the read gate, and insulating dielectric patterns interposed between the write and read gates and the semiconductor substrate. The read region may have a different conductivity type from the first and second junction patterns, and the write region may have the same conductivity type as the first and second junction patterns.

18 Claims, 10 Drawing Sheets

(56) References Cited

U.S. PATENT DOCUMENTS

| | | |
|---|---|---|
| 2006/0097345 A1 | 5/2006 | Marr |
| 2007/0210369 A1* | 9/2007 | Chen .................... H01L 27/115 |
| | | 257/315 |
| 2008/0182367 A1* | 7/2008 | Petti ..................... H01L 27/105 |
| | | 438/142 |
| 2008/0296651 A1* | 12/2008 | Yoshida ................ H01L 27/115 |
| | | 257/315 |
| 2009/0283835 A1* | 11/2009 | Yu ........................ H01L 21/268 |
| | | 257/368 |
| 2010/0061137 A1* | 3/2010 | Kim ........................ G11C 7/06 |
| | | 365/102 |
| 2010/0311231 A1* | 12/2010 | Thei ................ H01L 21/823842 |
| | | 438/587 |
| 2012/0211841 A1 | 8/2012 | Kurjanowicz |
| 2014/0035014 A1 | 2/2014 | Jeon |

* cited by examiner

MEMORY DEVICES INCLUDING ONE-TIME PROGRAMMABLE MEMORY CELLS

CROSS-REFERENCE TO RELATED APPLICATION

This U.S. non-provisional patent application claims priority under 35 U.S.C. § 119 to Korean Patent Application No. 10-2014-0130192, filed on Sep. 29, 2014 in the Korean Intellectual Property Office, the entire contents of which are hereby incorporated by reference.

BACKGROUND OF THE INVENTION

Example embodiments of the inventive concepts relate to semiconductor memory devices, and in particular, to memory devices including one-time programmable memory cells.

A one-time programmable (OTP) memory device is configured to have read-only memory cells, which can be programmed by a manufacturer, not a user, and is used in video game consoles, mobile phones, radio-frequency identification (RFID) tags, implantable medical devices, high-definition multimedia interfaces (HDMI) and in many other consumer and automotive electronics products. As the use of the OTP memory device continues to increase, it is necessary to develop technologies for satisfying technical needs associated with in-chip variation of electric characteristics of these memory devices.

SUMMARY

Example embodiments of the inventive concepts provide OTP memory devices that have reduced in-chip variation of electric characteristics.

Other example embodiments of the inventive concepts provide OTP memory devices which may have reduced deterioration in a program property which may be caused by a gate leakage current.

According to example embodiments of the inventive concepts, a one-time programmable (OTP) memory device may include a semiconductor substrate with a write region and a read region, a write gate on top of the write region, a read gate on top of the read region, a first junction pattern at a first side of the read gate, a second junction pattern at a second side of the read gate, and insulating dielectric patterns interposed between the write gate and the semiconductor substrate and between the read gate and the semiconductor substrate. The read region may have a different conductivity type from the first and second junction patterns, and the write region may have the same conductivity type as the first and second junction patterns.

In example embodiments, bottom surfaces of the write and read regions may extend deeper into the semiconductor substrate than bottom surfaces of the first and second junction patterns, when measured from a top surface of the semiconductor substrate.

In example embodiments, the write and read gates may comprise the same material and may have the same thicknesses.

In example embodiments, the write and read gates may include at least one of titanium nitride (TiN), tantalum nitride (TaN), titanium aluminum nitride (TiAlN), tantalum aluminum nitride (TaAlN), niobium nitride (NbN), vanadium nitride (VN), or tungsten nitride (WN).

In example embodiments, each of the insulating dielectric patterns may include first and second insulating layers that are sequentially stacked on the semiconductor substrate, and the second insulating layer may comprise at least one material having a dielectric constant that is higher than a dielectric constant of the first insulating layer or of a silicon oxide layer.

In example embodiments, the first junction pattern may be spaced apart from the write gate and the write region, when viewed in plan view, and the second junction pattern may be between the write gate and the read gate and may overlap the write region, when viewed in plan view.

In example embodiments, when viewed in plan view, the write region may be spaced apart from a center of the second junction pattern.

In example embodiments, each of the insulating dielectric patterns may cover a bottom surface and both side surfaces of a corresponding one of the write and read gates and may have a 'U'-shaped section.

In example embodiments, the device may further include gate spacers covering sidewalls of each of the write and read gates. Each of the spacers may have a width that decreases with increasing distance from the semiconductor substrate.

In example embodiments, the semiconductor substrate may be silicon substrate or a silicon-germanium substrate.

In example embodiments, the semiconductor substrate may have a first conductivity type, the first and second junction patterns may have a second conductivity type, and the write region may be an impurity well in the semiconductor substrate that has the second conductivity type.

In example embodiments, the semiconductor substrate may have a first conductivity type, the first and second junction patterns may have the first conductivity type, and the read region may be an impurity well in the semiconductor substrate that has a second conductivity type.

According to example embodiments of the inventive concepts, a one-time programmable (OTP) memory device may include a pair of contact plugs on a semiconductor substrate, first and second read gates provided between the pair of contact plugs, first and second write gates provided between the first and second read gates, a first junction pattern between the first read gate and the first write gate, a second junction pattern between the first write gate and the second write gate, and a third junction pattern between the second write gate and the second read gate. The semiconductor substrate may include first and second read regions below the respective first and second read gates, the first and second read regions having a different conductivity type than the first through third junction patterns, and a write region below the first and second write gates that has the same conductivity type as the first through third junction patterns.

In example embodiments, the device may further include at least one dummy gate between the first and second write gates.

In example embodiments, the first and second write gates, the first and second read gates, and the at least one dummy gate may comprise the same metallic material, which is selected from the group consisting of titanium nitride (TiN), tantalum nitride (TaN), titanium aluminum nitride (TiAlN), tantalum aluminum nitride (TaAlN), niobium nitride (NbN), vanadium nitride (VN), and tungsten nitride (WN).

In example embodiments, the device may further include insulating dielectric patterns between the semiconductor substrate and the first and second read gates and between the semiconductor substrate and the first and second write gates. Each of the insulating dielectric patterns may include first and second insulating layers that are sequentially stacked on the semiconductor substrate, and the second insulating layer may comprise at least one material that has a dielectric constant that is higher than a dielectric constant of the first insulating layer or of a silicon oxide layer.

In example embodiments, a boundary between the write region and the first read region may be between the first read gate and the first write gate when viewed in plan view.

In example embodiments, a boundary between the write region and the first read region may be spaced apart from a center of the first junction pattern when viewed in plan view.

In example embodiments, the semiconductor substrate may have a first conductivity type, the first through third junction patterns may have a second conductivity type that is opposite the first conductivity type, and the write region may be an impurity well in the semiconductor substrate that has a depth that is greater than depths of the first through third junction patterns, the write region having the second conductivity type.

In example embodiments, the semiconductor substrate may have a first conductivity type, the first through third junction patterns may have the first conductivity type, and the read region may be an impurity well in the semiconductor substrate that has a depth greater than depths of the first through third junction patterns, the write region having a second conductivity type that is opposite the first conductivity type.

According to example embodiments of the inventive concepts, a memory device includes a semiconductor substrate having a first conductivity type that has a write region therein that has a second conductivity type that is opposite the first conductivity type; a write gate on the write region of the semiconductor substrate; a first junction pattern having the second conductivity type on a first side of the write gate; and a second junction pattern having the second conductivity type on a second side of the write gate. The memory device is a one-time programmable (OTP) memory device.

In example embodiments, the memory device may further include an insulating dielectric pattern between the write gate and the write region, the insulating dielectric pattern comprising a first insulating layer having a first dielectric constant and a second insulating layer stacked on the first insulating layer opposite the write region that has a second dielectric constant that is greater than the first dielectric constant.

In example embodiments, the write region may be in an upper region of the semiconductor substrate, and a bottom surface of the write gate may extend below a top surface of the write region.

In example embodiments, a bottom surface of the write gate may extend below a bottom surface of the write region.

In example embodiments, a bottom surface of the write region may extend below bottom surfaces of the first and second junction patterns.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
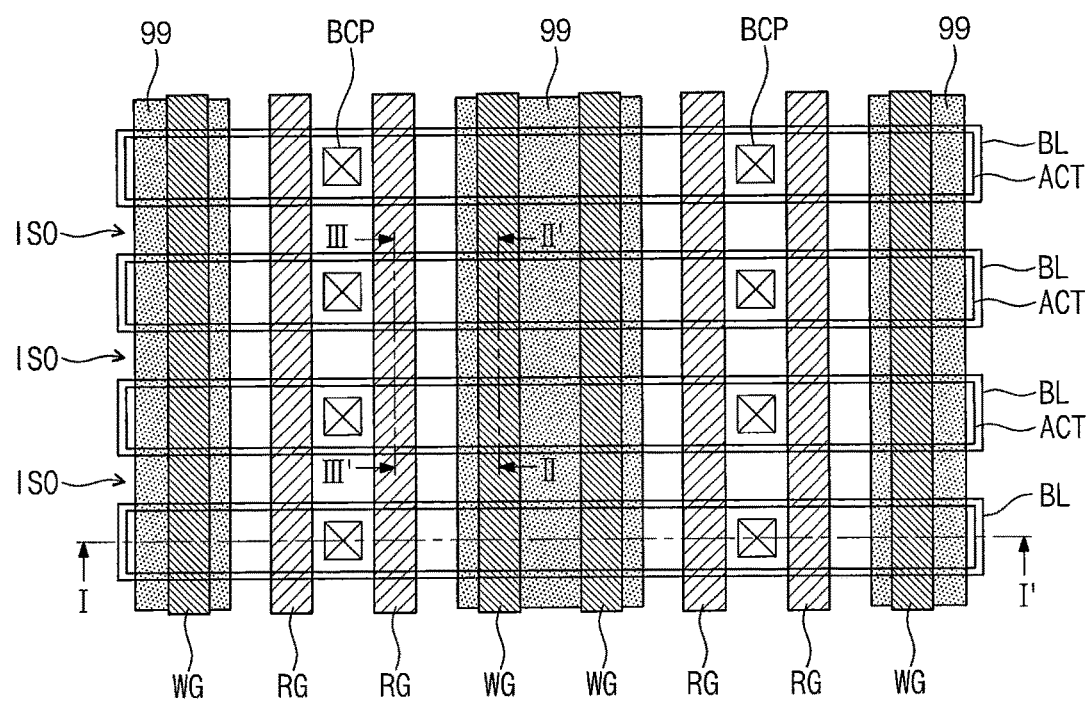
FIG. 1 is a plan view illustrating a portion of a cell array of an OTP memory device according to example embodiments of the inventive concepts.

It should be noted that these figures are intended to illustrate the general characteristics of methods, structure and/or materials utilized in certain example embodiments and to supplement the written description provided below. These drawings are not necessarily to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, steps, operations, elements and/or components, but do not preclude the presence or addition of one or more other features, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

Devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
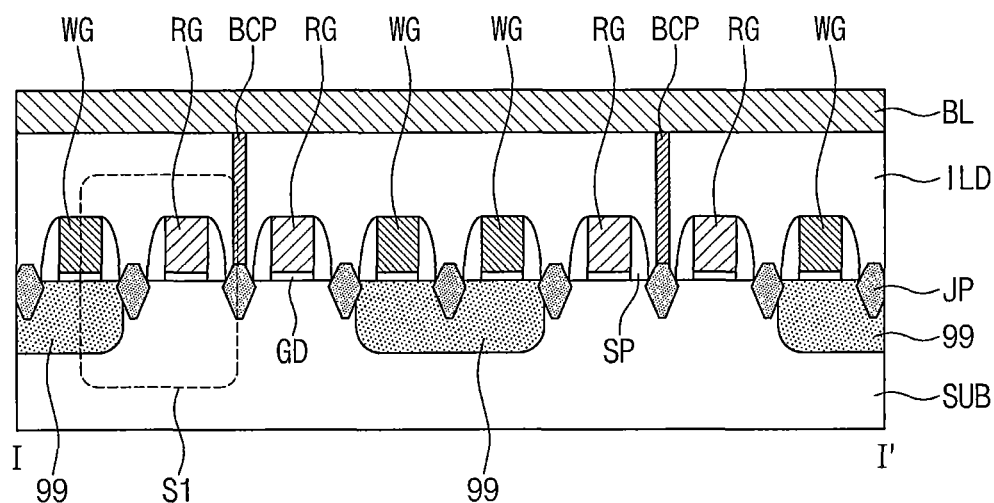
FIGS. 2 through 4 are sectional views taken along dotted lines I-I', II-II', and III-III', respectively, of FIG. 1.
Figure 3:
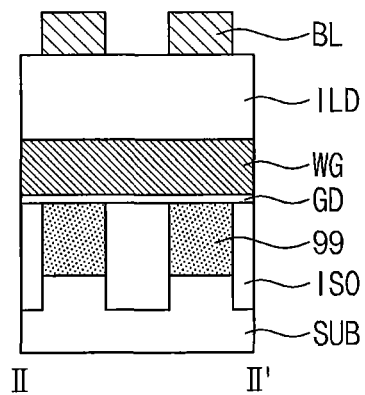
Figure 4:
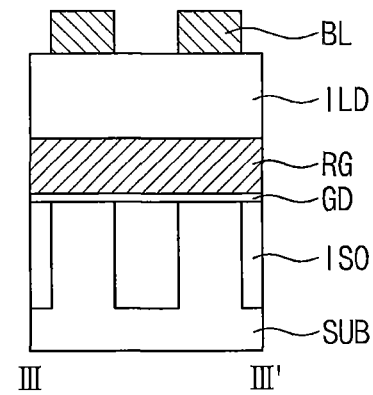

FIG. 1 is a plan view illustrating a portion of a cell array of an OTP memory device according to example embodiments of the inventive concepts, and FIGS. 2 through 4 are sectional views taken along dotted lines I-I', II-II', and III-III', respectively, of FIG. 1 to illustrate an OTP memory device according to example embodiments of the inventive concepts.

Referring to FIGS. 1 through 4, the OTP memory device includes a semiconductor substrate SUB and a cell array, which is provided on the semiconductor substrate SUB and includes a plurality of bit lines BL. The semiconductor substrate SUB may include active regions ACT that are defined by a device isolation layer ISO. The active regions ACT may extend in parallel to each other and may have a line or bar shape. The bit lines BL may be formed on the respective active regions ACT. For example, as shown in FIG. 1, each of the bit lines BL may overlap a corresponding one of the active regions ACT, when viewed in plan view.

The semiconductor substrate SUB may include at least one material that exhibits a semiconductor property. For example, the semiconductor substrate SUB may be a structure that is formed of or includes silicon or silicon germanium. The bit lines BL may include at least one conductive material. For example, the bit lines BL may be formed of or include at least one of aluminum, tungsten, copper, titanium nitride, tantalum nitride, tungsten nitride, or doped silicon.

The cell array may further include a plurality of gate patterns that are provided between the semiconductor substrate SUB and the bit lines BL. The gate patterns may cross the bit lines BL and the active regions ACT. The gate patterns may include write gates WG that are arranged in write gate pairs and read gates RG that are arranged in read gate pairs. Each of the write gate pairs may include two adjacent ones of the gate patterns, and each of the read gate pairs may include two other adjacent ones of the gate patterns.

The read gate pairs and the write gate pairs may be alternately disposed in the direction in which the bit lines BL extend. In other words, two of the write gates WG that constitute one write gate pair may be disposed between two read gate pairs that are adjacent to each other, and two of the read gates RG that constitute one read gate pair may be disposed between two write gate pairs that are adjacent to each other.

In some embodiments, the gate patterns may all be formed using the same process. Accordingly, the write and read gates WG and RG may be substantially the same in terms of material, thickness, and shape. For example, the write and read gates WG and RG may be formed of the same conductive material with a predetermined work function, thereby contributing to control a threshold voltage of the active regions ACT thereunder. In example embodiments, each of the write and read gates WG and RG may include at least one of metal nitrides or metals. For example, each of the write and read gates WG and RG may include a first metallic layer and a second metallic layer, which are sequentially stacked and are formed of different materials. In example embodiments, the first metallic layer may be a metal nitride layer (e.g., titanium nitride (TiN), tantalum nitride (TaN), titanium aluminum nitride (TiAlN), tantalum aluminum nitride (TaAlN), niobium nitride (NbN), vanadium nitride (VN), or tungsten nitride (WN)), and the second metallic layer may be a material (e.g., aluminum or tungsten), having a resistivity that is lower than that of the first metallic layer.

In the case where the semiconductor device is a CMOS device, the gate patterns may be formed by forming gate electrodes for NMOSFETs and then independently forming gate electrodes for PMOSFETs. However, example embodiments of the inventive concepts are not limited thereto The cell array may further include insulating dielectric patterns GD that are interposed between the gate patterns and the active regions ACT. For example, each of the gate patterns may be disposed to face the active regions ACT with the insulating dielectric patterns GD interposed therebetween. The insulating dielectric patterns GD may include at least one high-k dielectric material. The insulating dielectric patterns GD under the write gates WG may be substantially the same as those under the read gates RG, in terms of material, thickness, and shape.

In example embodiments, the insulating dielectric patterns GD may comprise at least one of hafnium oxide, hafnium silicate, zirconium oxide, or zirconium silicate, but the inventive concepts are not limited to these materials. For example, the insulating dielectric patterns GD may be formed of or include at least one of $HfO_2$, $ZrO_2$, $La_2O_3$, $AL_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, silicides thereof, and alloys thereof, where x ranges from about 0.5 to about 3 and y ranges from 0 to about 2. The insulating dielectric patterns GD may be formed, for example, by one of chemical vapor deposition (CVD), atomic layer deposition (ALD), molecular beam epitaxy (MBE), pulsed laser deposition (PLD), and liquid source misted chemical vapor deposition (LSMCD).

Figure 13:
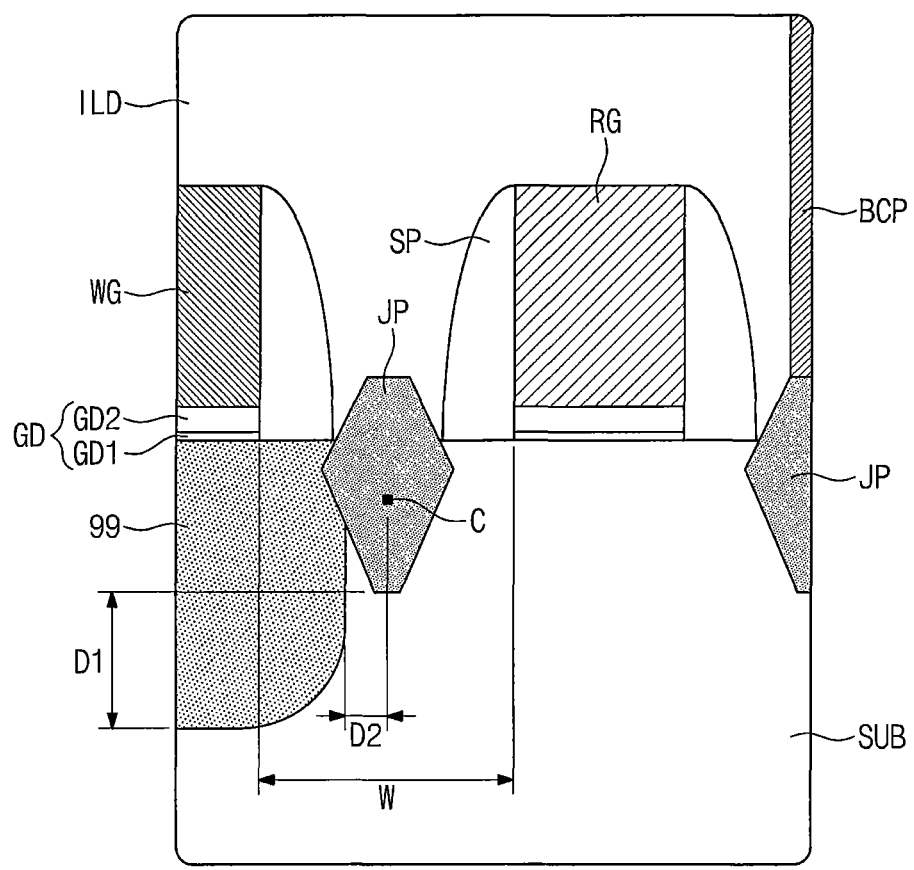
FIG. 13 is an enlarged view of a region denoted by a dotted line S1 of FIG. 2.

In example embodiments, as shown in FIG. 13, each of the insulating dielectric patterns GD may include a first gate insulating layer GD1 and a second gate insulating layer GD2, which are sequentially stacked. As an example, the first gate insulating layer GD1 may be a silicon oxide layer, and the second gate insulating layer GD2 may be an insulating material (e.g., hafnium oxide, hafnium silicate, zirconium oxide, or zirconium silicate) having a dielectric constant higher than that of the silicon oxide layer.

The cell array may further include a plurality of junction patterns JP that are disposed between the gate patterns, when viewed in plan view. For example, the junction patterns JP may be provided between the read gates RG constituting the read gate pairs, between the write gates WG constituting the write gate pairs, and between the write and read gate pairs.

The junction patterns JP may be provided on top surfaces of the respective active regions ACT and may be in direct contact with the semiconductor substrate SUB. A plurality of junction patterns JP may be on each of the active regions ACT, and the junction patterns JP that are on one of the active regions ACT may be spaced apart from the junction patterns JP that are on the other active regions ACT. In other words, the junction patterns JP may be two-dimensionally arranged on the semiconductor substrate SUB, and each of the junction patterns JP may overlap a corresponding one of the active regions ACT.

Each of the junction patterns JP may be a silicon germanium (SiGe) pattern that is formed by an epitaxial process, but example embodiments of the inventive concepts are not limited thereto. For example, the junction pattern JP for the NMOSFETs may be different from the junction patterns JP for the PMOSFETs in terms of material. As an example, the junction patterns JP may be formed of silicon carbide (SiC) for the NMOSFETs and may be formed of silicon germanium (SiGe) for the PMOSFETs. In the present embodiment, the junction patterns JP may be n-type junction patterns JP.

Each of the bit lines BL may be electrically connected to a corresponding one of the active regions ACT provided therebelow via a plurality of bit line plugs BCP. As shown in FIG. 1, when viewed in plan view, the bit line plugs BCP may be disposed between the read gates RG constituting the read gate pairs. As shown in FIG. 2, the bit line plugs BCP may be connected to respective ones of the junction patterns JP that are disposed between the read gates RG constituting the read gate pairs. In other words, according to the present embodiment, a plurality of the bit line plugs BCP may be provided on each active region ACT, and four gate patterns (i.e., a pair of the write gates WG constituting one write gate pair and a pair of the read gates RG from different read gate pairs) may be provided between each adjacent set of bit line plugs BCP. In example embodiments, although not illustrated, silicide patterns may be further formed between the bit line plugs BCP and the junction patterns JP.

As shown in FIG. 2, gate spacers SP may be provided on both sidewalls of each of the gate patterns. The gate spacers SP may be formed after the gate patterns, and each of the gate spacers SP may have a width that decreases in a direction away from the semiconductor substrate SUB. The gate spacers SP may include at least one of a silicon oxide layer, a silicon oxynitride layer, or a silicon nitride layer.

Further, an interlayer insulating layer ILD may be provided between the bit lines BL and the gate patterns. The interlayer insulating layer ILD may structurally support the bit lines BL and may electrically separate the bit lines BL from the gate patterns. The interlayer insulating layer ILD may include at least one of a silicon oxide layer, a silicon oxynitride layer, a silicon nitride layer, or a low-k dielectric layer. The bit line plugs BCP may be connected to the respective junction patterns JP through the interlayer insulating layer ILD.

As shown in FIGS. 1 and 2, an impurity region 99 may be formed in the semiconductor substrate SUB. As described above, in the case where the junction patterns JP are n-type junction patterns JP, the impurity region 99 may be formed below the write gates WG to have the same conductivity type (i.e., n-type) as that of the junction patterns JP. When viewed in plan view, the impurity region 99 may cross the bit lines BL. For example, the impurity region 99 may overlap the write gates WG constituting the write gate pairs and the junction patterns JP therebetween.

In the case where the impurity region 99 has the same conductivity type as that of the junction patterns JP, the write gate WG, the impurity region 99, and the junction patterns JP may be configured to operate in the same or similar manner as a depletion-mode transistor. This configuration may make it possible to reduce a gate leakage current between the write gates WG and the active region ACT thereunder. As will be described with reference to FIG. 16, such a reduction of the gate leakage current may reduce or prevent multi-programming characteristics of the device from being deteriorated.

Figure 5:
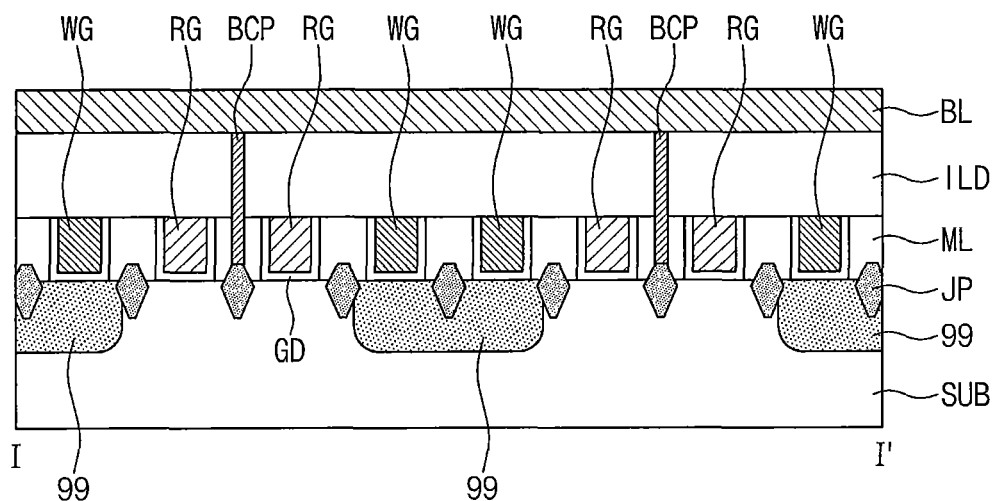
FIGS. 5 through 7 are sectional views taken along dotted lines I-I', II-II', and III-III', respectively, of FIG. 1 to illustrate an OTP memory device according to further example embodiments of the inventive concepts.
Figure 6:
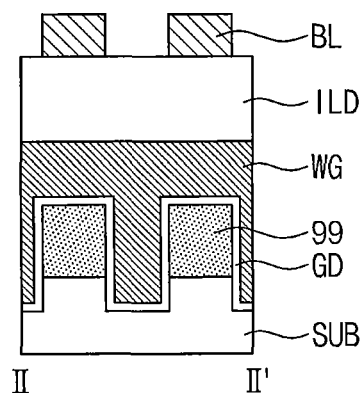
Figure 7:
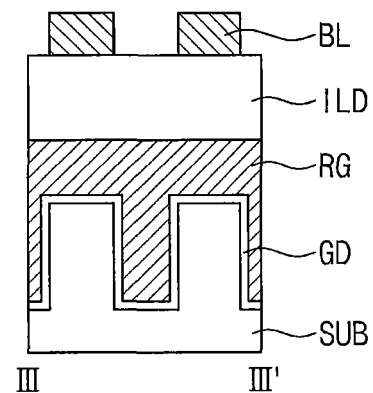

FIGS. 5 through 7 are sectional views taken along dotted lines I-I', II-II', and III-III', respectively, of FIG. 1 to illustrate an OTP memory device according to further example embodiments of the inventive concepts. For concise description, a previously described element may be identified by a similar or identical reference number without repeating the description thereof.

In the present embodiment, a cell array of an OTP memory device may include a plurality of bit lines BL that are provided on a semiconductor substrate SUB, a plurality of gate patterns that are provided between the semiconductor substrate SUB and the bit lines BL, and insulating dielectric patterns GD that are interposed between the gate patterns and the active regions ACT.

The semiconductor substrate SUB may include active regions ACT, which are parallel to each other and each of which is shaped like a line or bar, and the bit lines BL may be formed on the respective active regions ACT. The gate patterns may cross the bit lines BL and the active regions ACT.

The gate patterns may include write gates WG constituting write gate pairs and read gates RG constituting read gate pairs. Each of the write gate pairs may include two adjacent ones of the gate patterns, and each of the read gate pairs may include two other adjacent ones of the gate patterns. Each of the gate patterns may be used as one of the write and read gates WG and RG. Each of the write and read gates WG and RG may include at least one of metal nitrides or metals. The insulating dielectric patterns GD may include at least one high-k dielectric material.

In the present embodiment, as shown in FIG. 5, each of the gate patterns may be formed by a gate-last process. For example, the gate patterns may be formed by forming sacrificial gate patterns, forming a mold layer ML to cover the resulting structure with the sacrificial gate patterns, planarizing the mold layer ML to expose top surfaces of the sacrificial gate patterns, removing the sacrificial gate patterns to form gate regions, and then, sequentially forming the insulating dielectric patterns GD and the gate patterns. In this case, each of the insulating dielectric patterns GD may cover bottom and side surfaces of each of the gate patterns, as shown in FIG. 5. In other words, the insulating dielectric patterns GD may be formed to have a 'U'-shaped section.

As shown in FIGS. 6 and 7, each of the gate patterns may have a bottom surface that is lower than the highest portion of the top surface of the semiconductor substrate SUB. In other words, each gate pattern may include a portion (hereinafter referred to as the vertically extended portion) that is positioned between the active regions ACT to face both sidewalls of each of the active regions ACT. In example embodiments, although not illustrated, an additional insulating pattern may be further interposed between the vertical extended portion and the semiconductor substrate SUB. Furthermore, although not illustrated, an insulating pattern may be further provided on the active region ACT and may be used, along with the insulating dielectric patterns GD, to separate the gate pattern from the active region.

Similar to that previously described with reference to FIG. 13, each of the insulating dielectric patterns GD may include a first gate insulating layer GD1 and a second gate insulating layer GD2, which are sequentially stacked. As an example, the first gate insulating layer GD1 may be a silicon oxide layer, and the second gate insulating layer GD2 may be an insulating material (e.g., hafnium oxide, hafnium silicate, zirconium oxide, or zirconium silicate) having a dielectric constant higher than that of the silicon oxide layer.

Except for the afore-described differences, the OTP memory device of the present embodiment may be configured to have substantially the same technical features as the OTP memory device described above with reference to FIGS. 1 through 4.

Figure 8:
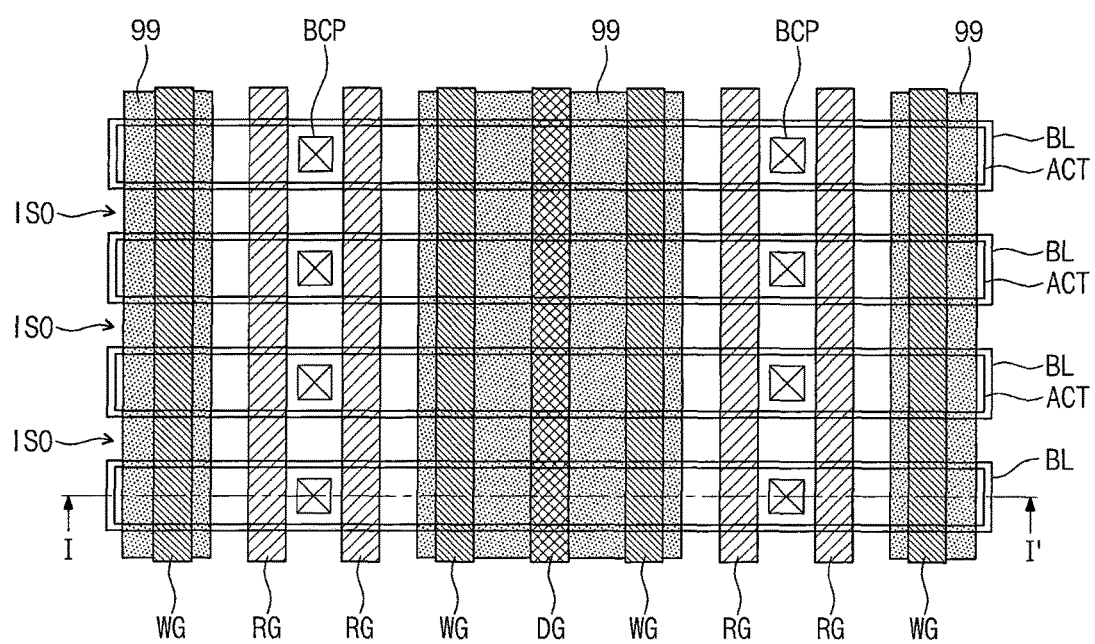
FIG. 8 is a plan view illustrating a portion of a cell array of an OTP memory device according to still other example embodiments of the inventive concepts.
Figure 9:
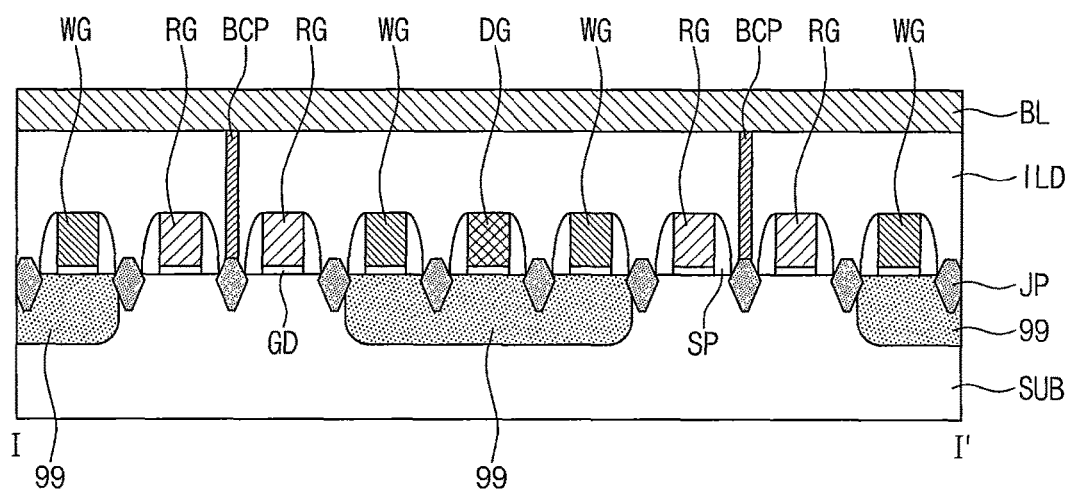
FIG. 9 is a sectional view taken along dotted line I-I' of FIG. 8 that illustrates an OTP memory device according to still further example embodiments of the inventive concepts.
Figure 10:
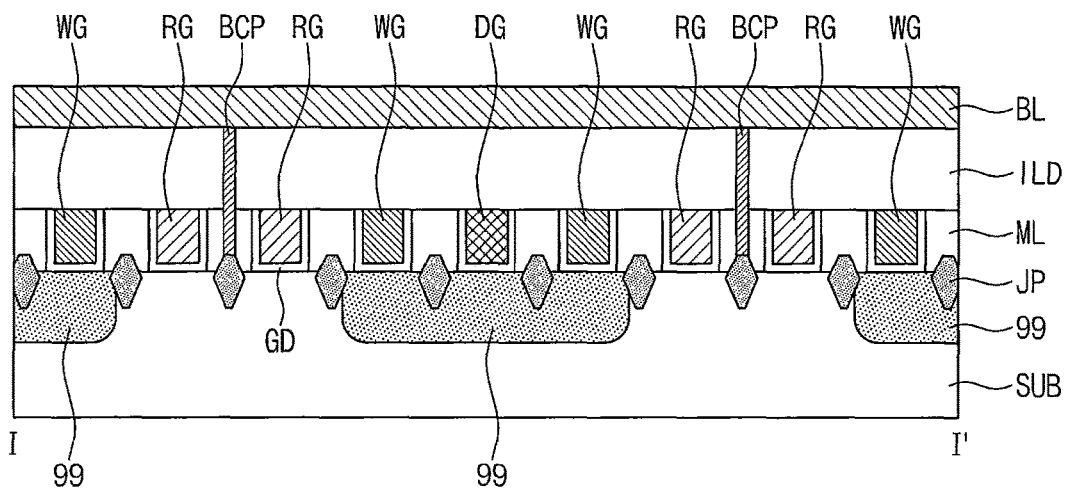
FIG. 10 is a sectional view taken along dotted line I-I' of FIG. 8 that illustrates an OTP memory device according to yet additional further example embodiments of the inventive concepts.

FIG. 8 is a plan view illustrating a portion of a cell array of an OTP memory device according to still other example embodiments of the inventive concepts, and FIGS. 9 and 10 are sectional views taken along dotted line I-I' of FIG. 8 to illustrate OTP memory devices according to still further embodiments of the inventive concepts. For concise description, a previously described element may be identified by a similar or identical reference number without repeating the description thereof.

In the embodiments of FIGS. 8-10, the cell arrays of the OTP memory devices may include a plurality of bit lines BL that are on a semiconductor substrate SUB, a plurality of gate patterns that are between the semiconductor substrate SUB and the bit lines BL, and insulating dielectric patterns GD that are interposed between the gate patterns and the active regions ACT.

The semiconductor substrate SUB may include active regions ACT, which are parallel to each other and each of which is shaped like a line or bar, and the bit lines BL may be formed on the respective active regions ACT. The gate patterns may cross the bit lines BL and the active regions ACT.

As shown in FIGS. 8 through 10, the gate patterns may include write gates WG constituting write gate pairs, read gates RG constituting read gate pairs, and dummy gates DG. In example embodiments, as shown in FIG. 9, the write, read, and dummy gates WG, RG, and DG may be formed to have substantially the same structural features as those in the previous embodiments described with reference to FIGS. 2 through 4. In other embodiments, as shown in FIG. 10, the write, read, and dummy gates WG, RG, and DG may be formed to have substantially the same structural features as those in the previous embodiments described with reference to FIGS. 5 through 7.

Each of the write gate pairs may include a pair of the gate patterns that are positioned adjacent to each other with one of the dummy gates DG interposed therebetween. In other words, each of the dummy gates DG may be disposed between a pair of the write gates WG constituting each of the write gate pairs to cross the bit lines BL and the active regions ACT. Each of the read gate pairs may also include two other adjacent ones of the gate patterns. Each of the gate patterns may be used as one of the write, read, and dummy gates WG, RG, and DG. Each of the write, read, and dummy gates WG, RG, and DG may be formed of or include at least one of metal nitrides or metals. The insulating dielectric patterns GD may be formed of or include at least one high-k dielectric material.

As shown in FIGS. 9 and 10, an impurity region 99 may be formed in the semiconductor substrate SUB. In the case where the junction patterns JP are n-type junction patterns JP, the impurity region 99 may be formed below the write and dummy gates WG and DG to have the same conductivity type (i.e., n-type) as that of the junction patterns JP. When viewed in plan view, the impurity region 99 may cross the bit lines BL. For example, the impurity region 99 may overlap the write gates WG, the dummy gate DG, and the junction patterns JP therebetween.

Except for the afore-described differences, the OTP memory device of the present embodiments may have substantially the same technical features as the OTP memory device described with reference to FIGS. 1 through 4.

Figure 11:
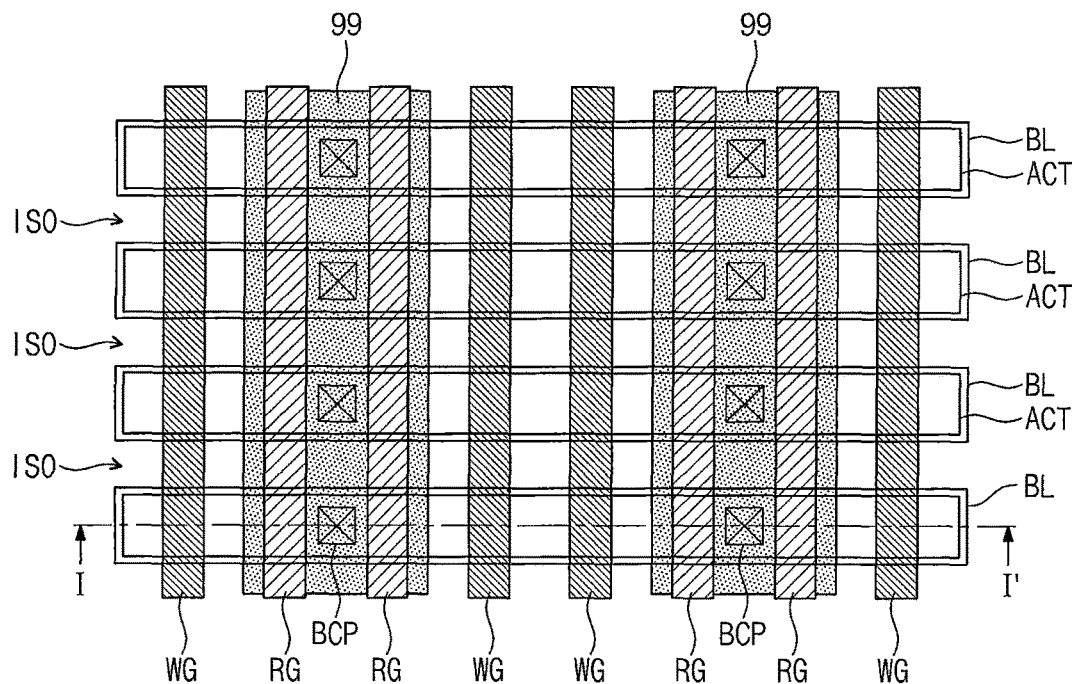
FIG. 11 is a plan view illustrating a portion of a cell array of an OTP memory device according to still further example embodiments of the inventive concepts.
Figure 12:
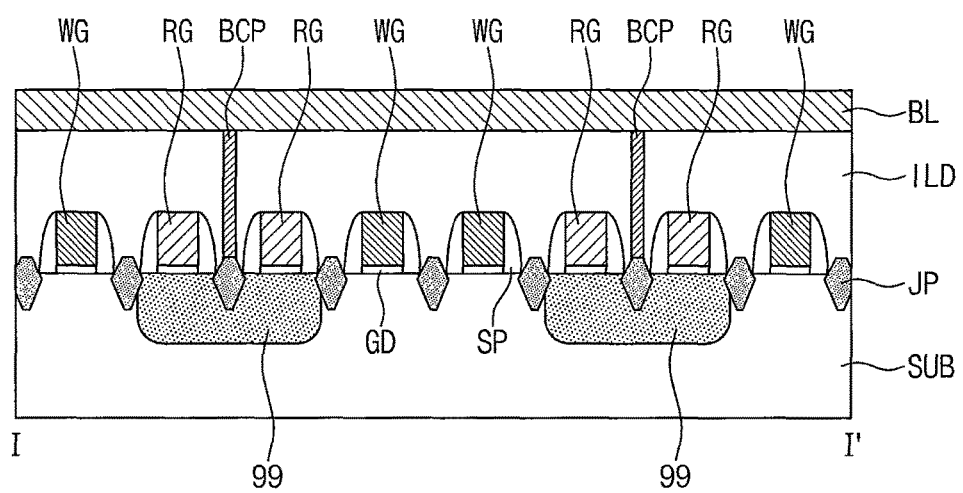
FIG. 12 is a sectional view taken along dotted line I-I' of FIG. 11.

FIG. 11 is a plan view illustrating a portion of a cell array of an OTP memory device according to further example embodiments of the inventive concepts, and FIG. 12 is a sectional view taken along dotted line I-I' of FIG. 11. For concise description, a previously described element may be identified by a similar or identical reference number without repeating the description thereof. A cell array of an OTP memory device according to the present embodiment may differ from that of the previous embodiment described with reference to FIGS. 1 through 4, in terms of conductivity type of the junction patterns JP and positions of the impurity regions 99. Hence, descriptions of other elements may be omitted. Further, the other example embodiments described with reference to FIGS. 5 through 10 may also be modified to have the following technical differences that are described herein with reference to FIGS. 11 and 12.

Referring to FIGS. 11 and 12, the junction patterns JP may be formed to have the same conductivity type (e.g., p-type) as that of the semiconductor substrate SUB. In this case, the impurity region 99 may have a different conductivity type (i.e., n-type) from that of the junction patterns JP and may overlap the read gates RG. For example, when viewed in plan view, the impurity region 99 may cross the bit lines BL and may overlap the read gates RG and the junction patterns JP therebetween.

Except for the afore-described differences, the OTP memory device of the present embodiment may be configured to have substantially the same technical features as the OTP memory device described above with reference to FIGS. 1 through 4.

FIG. 13 is an enlarged view of a region denoted by a dotted line S1 of FIG. 2.

Referring to FIG. 13, the impurity region 99 may include a portion that is positioned between the write gate WG and the read gate RG adjacent thereto, when viewed in a plan view. Here, the impurity region 99 may overlap the write gate WG but may not overlap the read gate RG. For example, a horizontal boundary of the impurity region 99 may be formed at a position spaced apart from a center C of the junction pattern JP, which is provided between the write gate WG and the read gate RG adjacent thereto. The impurity region 99 may be spaced apart from the junction pattern JP connected to the bit line plug BCP.

The impurity region 99 may be formed deeper than the junction patterns JP, when viewed in a vertical section. In other words, the impurity region 99 may have a bottom surface that is positioned at a deeper level than those of the junction patterns JP, when measured from the top surface of the semiconductor substrate SUB.

Other example embodiments of the inventive concepts described with reference to FIGS. 5 through 12 may be modified to have technical features, which are associated with positions of horizontal and vertical boundaries of the impurity region 99 and the structure of the insulating dielectric patterns GD described with reference to FIG. 13.

Figure 14:
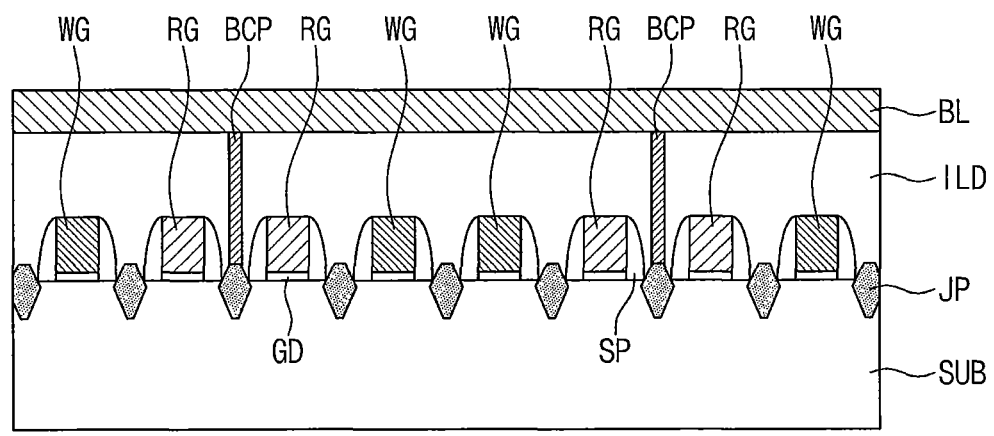
FIG. 14 is a sectional view illustrating a portion of a cell array of an OTP memory device according to a comparative example.

FIG. 14 is a sectional view illustrating a portion of a cell array of an OTP memory device according to a comparative example. For concise description, a previously described element may be identified by a similar or identical reference number without repeating the description thereof.

Compared to the OTP memory device of FIG. 2, the OTP memory device of FIG. 14 may not include the impurity region 99. In other words, for the OTP memory device of FIG. 14, the active region ACT below the write gate WG may have a different conductivity type from the junction patterns JP, and thus, the write gate WG, the impurity region 99, and the junction patterns JP may operate as an enhancement mode transistor.

Figure 15:
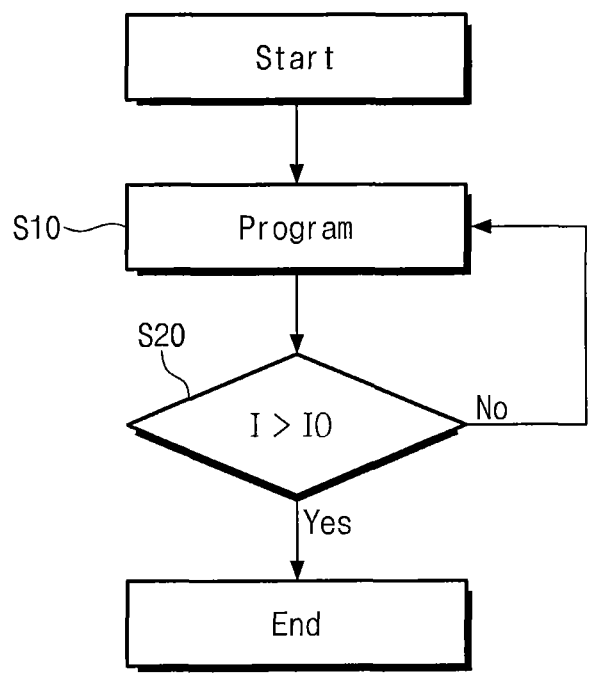
FIG. 15 is a flow chart exemplarily illustrating an operation of programming an OTP memory device.
Figure 16:
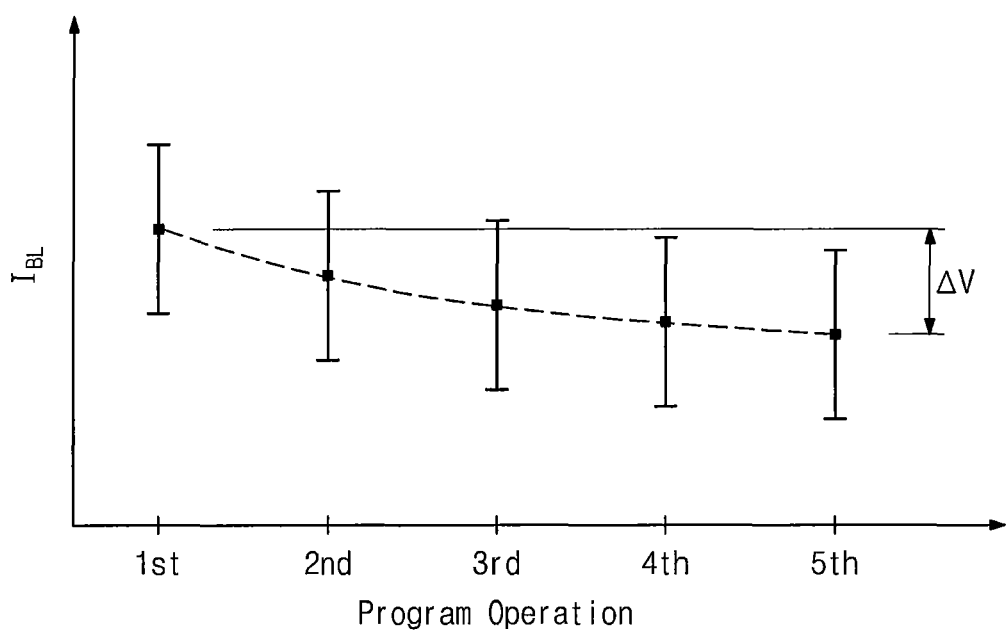
FIG. 16 is a graph showing program characteristics of the OTP memory device according to the comparative example.

FIG. 15 is a flow chart exemplarily illustrating an operation of programming an OTP memory device, and FIG. 16 is a graph showing program characteristics of the OTP memory device according to the comparative example.

As shown in FIG. 15, a programming operation of an OTP memory device may include performing a programming step (in S10) and examining whether the programming step is effectively performed (in S20) by determining whether a read current (I) is greater than a predetermined value (IO).

Due to an in-chip variation of a program property, some of memory cells constituting the OTP memory device may not have a desired program property. For example, in some programmed cells, the read current may be smaller than a desired value. To overcome such an incomplete programming problem, the programming step may be performed again on the incompletely programmed cells, as shown in FIG. 15. However, since the additional programming step is performed on OTP memory cell, whose resistances have already been lowered by the initial programming step, the amount of the programming current flowing through the selected memory cell during the additional programming step may be excessively increased, compared to those of memory cells on which the programming step has not been performed again.

If the insulating dielectric patterns GD of the OTP memory device include a high-k dielectric, the increase of the programming current may lead to several technical issues, such as an excessive Joule heating in the relevant memory cell and the consequent disconnection of an oxygen vacancy conduction path. Accordingly, as shown in FIG. 16, an effect opposite to what was intended may occur. Repetition of the additional programming step may lead to reduction of the read current of the memory cell.

By contrast, for the OTP memory devices described with reference to FIGS. 1 through 12, the write gate WG, the impurity region 99, and the junction patterns JP may operate as a depletion-mode transistor exhibiting a lower gate leakage property, and this makes it possible to reduce or mitigate technical issues which may occur in the OTP memory device of the comparative example.

Figure 17:
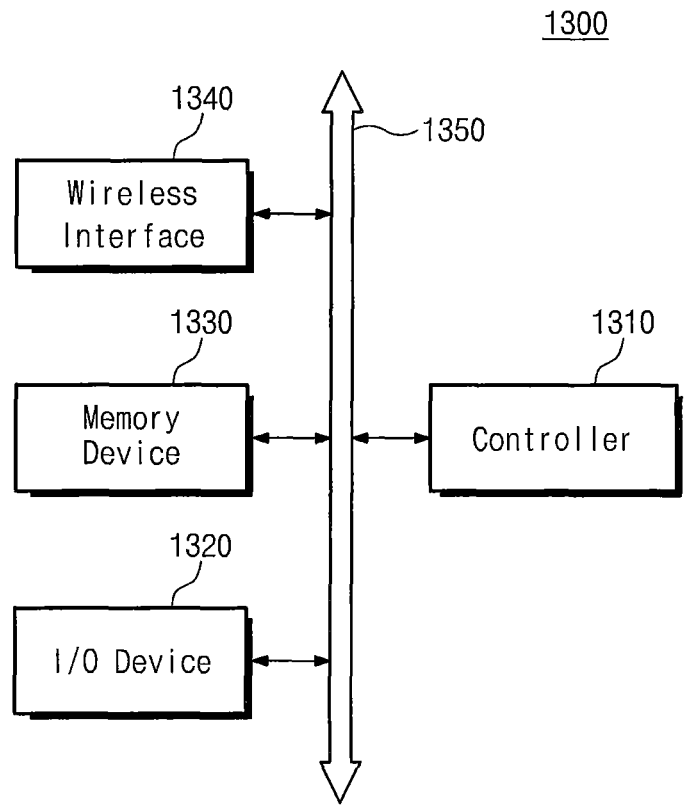
FIGS. 17 and 18 are schematic diagrams exemplarily illustrating electronic devices including a semiconductor device according to example embodiments of the inventive concepts.
Figure 18:
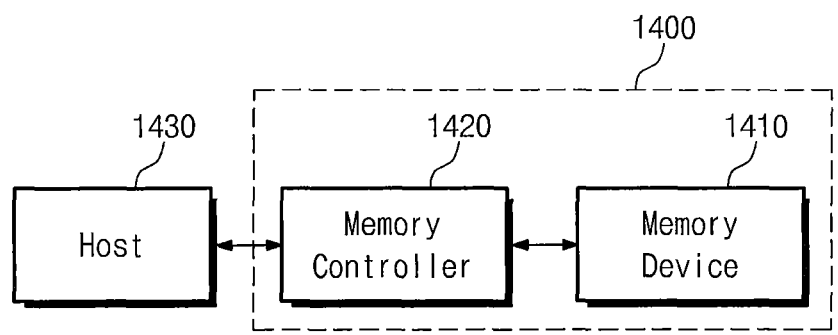

FIGS. 17 and 18 are schematic block diagrams illustrating electronic devices including semiconductor devices according to example embodiments of the inventive concepts.

Referring to FIG. 17, an electronic device 1300 including a semiconductor device according to example embodiments of inventive concepts may be used in one of a personal digital assistant (PDA), a laptop computer, a mobile computer, a web tablet, a wireless phone, a cell phone, a digital music player, a wire or wireless electronic device, or a complex electronic device including at least two ones thereof. The electronic device 1300 may include a controller 1310, an input/output device 1320 such as a keypad, a keyboard, a display, a memory 1330, and a wireless interface 1340 that are combined to each other through a bus 1350. The controller 1310 may include, for example, at least one microprocessor, a digital signal processor, a microcontroller or the like. The memory 1330 may be configured to store a command code to be used by the controller 1310 or user data. The memory 1330 may include a semiconductor device according to example embodiments of inventive concepts. The electronic device 1300 may use a wireless interface 1340 configured to transmit data to or receive data from a wireless communication network using an RF signal. The wireless interface 1340 may include, for example, an antenna, a wireless transceiver and so on. The electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Referring to FIG. 18, a memory system including a semiconductor device according to example embodiments of inventive concepts will be described. The memory system 1400 may include a memory device 1410 for storing large amounts of data and a memory controller 1420. The memory controller 1420 controls the memory device 1410 so as to read data stored in the memory device 1410 or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410 may be a semiconductor device according to example embodiments of inventive concepts.

The semiconductor memory devices disclosed above may be encapsulated using various and diverse packaging techniques. For example, the semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (S SOP) technique, a thin small outline package (TSOP) technique, a system in package (SIP) technique, a multi-chip package (MCP) technique, a wafer-level fabricated package (WFP) technique and a wafer-level processed stack package (WSP) technique.

The package in which a semiconductor memory device according to example embodiments may be mounted may further include at least one semiconductor device (e.g., a controller and/or a logic device) that is configured to control the semiconductor memory device.

According to example embodiments of the inventive concepts, a portion (e.g., a write region) of an active region positioned below a write gate has the same conductivity type as the junction patterns. This may reduce a gate leakage current between the write gate and the write region thereunder. By virtue of such a reduction of the gate leakage current, it is possible to reduce or prevent program characteristics of the device from being deteriorated. Accordingly, the OTP memory device can be fabricated to have a reduced in-chip variation.

While example embodiments of the inventive concepts have been particularly shown and described, it will be understood by one of ordinary skill in the art that variations in form and detail may be made therein without departing from the spirit and scope of the attached claims.

What is claimed is:

1. A memory device, comprising:
    a semiconductor substrate having a first conductivity type;
    an impurity region in a top region of the semiconductor substrate, wherein the impurity region has a second conductivity type that is different from the first conductivity type;
    a write gate on a top surface of the impurity region;
    a read gate on a top surface of the semiconductor substrate;
    a first junction pattern at and directly adjacent a first side of the read gate; and
    a second junction pattern at and directly adjacent a second side of the read gate and directly adjacent a first side of the write gate,
    wherein each of the first and second junction patterns have the second conductivity type,
    wherein the first junction pattern is spaced apart from the impurity region,
    wherein the second junction pattern contacts the impurity region.

2. The memory device of claim 1, the memory device further comprising:
    a contact plug on the first junction pattern and connected to the first junction pattern; and
    an insulating dielectric pattern between the write gate and the top surface of the impurity region and between the read gate and the top surface of the semiconductor substrate.

3. The memory device of claim 2, wherein the second junction pattern contacts the semiconductor substrate and the impurity region.

4. The memory device of claim 1, the memory device further comprising a third junction pattern directly adjacent a second side of the write gate, wherein the third junction pattern contacts the impurity region.

5. The memory device of claim 1, wherein the semiconductor substrate comprises active regions, each of the write gate and the read gate has a portion positioned between the active regions of the semiconductor substrate, and
    wherein the portion of the write gate and the portion of the read gate face sidewalls of the active regions of the semiconductor substrate.

6. A memory device, comprising:
    a semiconductor substrate having a first conductivity type;
    an impurity region in the semiconductor substrate, wherein the impurity region has a second conductivity type that is different from the first conductivity type;
    an insulating dielectric pattern on a top surface of the semiconductor substrate and on a top surface of the impurity region;
    first and second read gates on the insulating dielectric pattern opposite the semiconductor substrate;
    first and second write gates on the insulating dielectric pattern opposite the impurity region; and
    a first junction pattern between the first write gate and the second write gate;

a second junction pattern between the first read gate and the second read gate; and a contact plug disposed between the first read gate and the second read gate and connected to the second junction pattern, wherein the first junction pattern has a bottom surface surrounded by the impurity region, wherein the second junction pattern is spaced apart from the impurity region, and wherein the first and second junction patterns have the second conductivity type.

7. The memory device of claim 6, the memory device further comprising a third junction pattern between the first read gate and the first write gate, wherein the third junction contacts the semiconductor substrate and the impurity region.

8. The memory device of claim 6, the memory device further comprising a bit line that crosses over the first write gate, the second write gate, the first read gate, and the second read gate and that is connected to the contact plug.

9. The memory device of claim 6, wherein the semiconductor substrate comprises active regions, wherein the first write gate, the second write gate, the first read gate, and the second read gate have portions that are positioned between the active regions of the semiconductor substrate respectively, wherein the portions of the first write gate, the second write gate, the first read gate, and the second read gate face sidewalls of the active regions of the semiconductor substrate, respectively.

10. A memory device, comprising:

a semiconductor substrate having a first conductivity type;

an impurity region in a top region of the semiconductor substrate, wherein the impurity region has a second conductivity type that is different from the first conductivity type;

a read gate on a top surface of the semiconductor substrate;

a first write gate on a top surface of the impurity region;

a first junction pattern directly adjacent a first side of the first write gate;

a second junction pattern on a second side of the read gate, wherein the first junction pattern is adjacent a first side of the read gate; and a bit line contact plug disposed on the second junction pattern and connected to the second junction pattern;

wherein the first junction pattern contacts the impurity region, wherein the first junction pattern has the second conductivity type, and wherein the second junction pattern has the second conductivity type.

11. The memory device of claim 10, wherein a bottom surface of the impurity region extends below a bottom surface of the first junction pattern, the memory device further including an insulating dielectric pattern between the first write gate and the top surface of the impurity region and between the read gate and the top surface of the semiconductor substrate.

12. The memory device of claim 10, wherein the first junction pattern further contacts the semiconductor substrate.

13. The memory device of claim 12, wherein the first junction pattern is disposed between the read gate and the first write gate, wherein the read gate and the first write gate are adjacent each other.

14. The memory device of claim 10, wherein the first junction pattern has a bottom surface that is surrounded by the impurity region, the memory device further comprising a second write gate on the top surface of the impurity region, wherein the first write gate and the second write gate are adjacent each other, wherein the first junction pattern is between the first write gate and the second write gate.

15. The memory device of claim 14, the read gate comprises a first read gate, the memory device further comprising
a second read gate on the top surface of the semiconductor substrate;

wherein the second junction pattern is between the first read gate and the second read gate, and wherein the second junction pattern contacts the semiconductor substrate.

16. The memory device of claim 10, the memory device further comprising a third junction pattern directly adjacent a second side of the first write gate, wherein the third junction pattern has a bottom surface that is surrounded by the impurity region.

17. The memory device of claim 16, the memory device further comprising:

a second write gate on the top surface of the impurity region; and a fourth junction pattern directly adjacent a first side of the second write gate, wherein the third junction pattern is directly adjacent a second side of the second write gate, and wherein the fourth junction pattern contacts the semiconductor substrate and the impurity region.

18. The memory device of claim 10, wherein the semiconductor substrate comprises active regions, wherein the first write gate has a vertically extended portion positioned between active regions of the semiconductor substrate, wherein the read gate has a vertically extended portion positioned between the active regions of the semiconductor substrate, and wherein the vertically extended portion of the read gate and the vertically extended portion of the first write gate face sidewalls of the active regions of the semiconductor substrate.

* * * * *